United States Patent
Boyd et al.

[11] Patent Number: 6,040,214
[45] Date of Patent: Mar. 21, 2000

[54] METHOD FOR MAKING FIELD EFFECT TRANSISTORS HAVING SUB-LITHOGRAPHIC GATES WITH VERTICAL SIDE WALLS

[75] Inventors: Diane C. Boyd, Lagrangeville, N.Y.; Stuart M. Burns, Brookfield, Conn.; Hussein I. Hanafi, Goldens Bridge, N.Y.; Yuan Taur, Bedford, N.Y.; William C. Wille, Red Hood, N.Y.

[73] Assignee: International Business Machines Corporation, Armonk, N.Y.

[21] Appl. No.: 09/026,261

[22] Filed: Feb. 19, 1998

[51] Int. Cl.[7] .................... H01L 21/8242; H01L 21/20
[52] U.S. Cl. .................... 438/244; 438/248; 438/387
[58] Field of Search .................... 438/244, 248, 438/387, 391

[56] References Cited

U.S. PATENT DOCUMENTS

| | | | |
|---|---|---|---|
| 4,353,086 | 10/1982 | Jaccodine et al. | 357/51 |
| 4,430,791 | 2/1984 | Dockerty | 29/571 |
| 4,636,822 | 1/1987 | Codella et al. | 357/22 |
| 4,734,384 | 3/1988 | Tsuchiya | 437/52 |
| 4,758,528 | 7/1988 | Goth et al. | 437/15 |
| 4,980,310 | 12/1990 | Matsuda et al. | 437/52 |
| 5,013,680 | 5/1991 | Lowrey et al. | 437/52 |
| 5,223,447 | 6/1993 | Lee et al. | 437/47 |
| 5,792,686 | 8/1998 | Chen et al. | 438/244 |

OTHER PUBLICATIONS

R.A. Colclaser, John Wiley & Sons,"Micro Electronics Processing and Device Design" 1980, Chapter 10, pp. 266–269. Month unknown.

Primary Examiner—David Nelms
Assistant Examiner—Michael S. Lebentritt
Attorney, Agent, or Firm—Scully, Scott, Murphy & Presser; Tiffany L. Townsend

[57] ABSTRACT

A method for the formation of field effect transistors (FETs), and more particularly metal oxide field effect transistors (MOSFETs), comprising the steps of: forming a dielectric stack on a semiconductor structure; defining an etch window on the dielectric stack; defining a gate hole in the dielectric stack by transferring the etch window into the dielectric stack using a reactive ion etching (RIE) process; depositing a side wall layer; removing the side wall layer from horizontal surfaces of the dielectric stack and gate hole such that side wall spacers remain which reduce the lateral size of the gate hole; depositing a gate conductor such that it fills the gate hole; removing the gate conductor covering the portions of the semiconductor structure surrounding the gate hole; removing at least part of the dielectric stack; and removing the side wall spacers.

29 Claims, 6 Drawing Sheets

METHOD FOR MAKING FIELD EFFECT TRANSISTORS HAVING SUB-LITHOGRAPHIC GATES WITH VERTICAL SIDE WALLS

TECHNICAL FIELD

The present invention concerns methods for making metal-oxide-semiconductor field effect transistors (MOSFETs) in general, and MOSFETs with gates of sub-lithographic length and vertical side walls, in particular.

BACKGROUND OF THE INVENTION

The size, shape, and quality of the polysilicon gate of MOSFETs are of particular concern for conventional as well as future scaled-down MOSFETs.

In order to be able to make memory chips and logic devices of higher integration density than currently feasible, one has to find a way to further scale down the gates used in such chips and devices and to improve the accuracy at which such gates are made.

Figure 1:
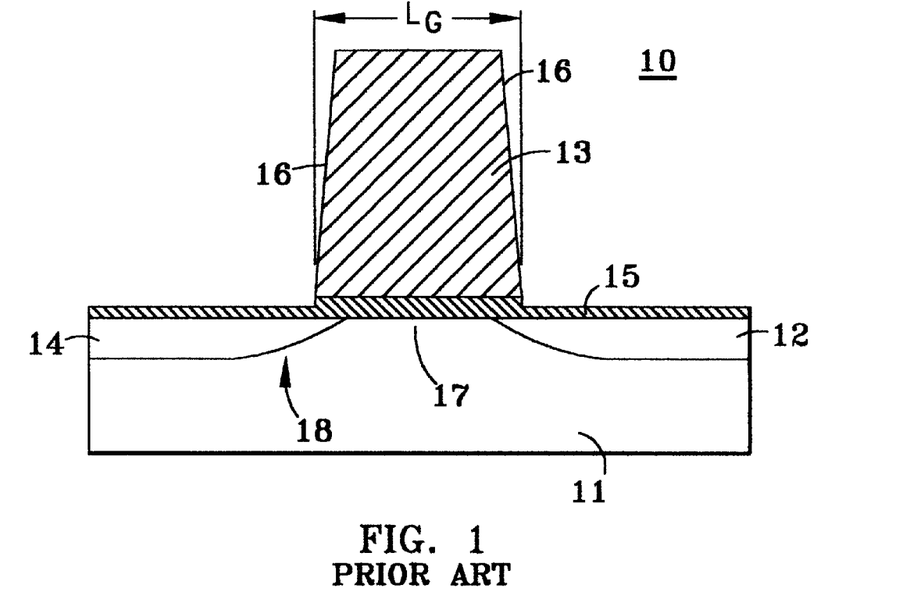
FIG. 1 is a schematic cross section of the basic structure of a conventional MOSFET.

The basic elements of a conventional MOSFET 10 are schematically illustrated in FIG. 1. Such an FET 10 typically is formed in a silicon substrate 11 and comprises a doped source region 14 and a doped drain region 12 being arranged to the left and right of a polysilicon gate pillar 13. This gate pillar 13 is separated from the channel 17—which is situated between the source 14 and drain regions 12—by an oxide layer 15. Underneath the polysilicon gate 13, the oxide layer 15 serves as gate oxide. In conventional FETs, the gate oxide is thicker underneath the polysilicon gate, because the portions of the oxide layer 15 not covered by the polysilicon gate are attacked during the polysilicon RIE, as addressed in the following. Please note that the source/channel and drain/channel junctions 18 are not abruptly defined. The dopant concentration decreases the closer one gets to the actual channel, i.e. the source/channel and drain/channel junctions 18 are not well defined. This is mainly caused by the sloped side walls 16 of the gate 13 which permit dopants to reach the silicon substrate near the gate edges (overlapping the gate) when the source and drain regions 12 and 14 are implanted from the top. This results in increased source and drain resistance, high overlap capacitance, and ill defined effective channel length resulting in degrading the device performance.

In the present state of the art, silicon reactive ion etching (RIE) and a photo-resist mask are used to define the polysilicon gates of MOSFETs, including complementary metal oxide semiconductor (CMOS) FETs. Two requirements have to be satisfied by the RIE process. The polysilicon gates should have perfectly vertical side walls, and furthermore, one has to ensure that the RIE process stops on the gate oxide 15 at the bottom of the polysilicon gate 13 without destroying it. Typically, the gate oxide 15 is very thin (in the range of a few nanometers) and becomes thinner and thinner when further scaling down FETs.

When processing whole wafers, the thickness of the polysilicon layer—which is to be etched to become the polysilicon gate of all MOSFETs on the wafer—varies. To ensure that all polysilicon gates are defined properly, one has to adjust the etch time such that all polysilicon gates, including those formed in a section of the wafer where the polysilicon layer is relatively thick, are etched down to the thin gate oxide 15. This intentional over-etching, however, leads to a locally reduced thickness of the gate oxide 15 adjacent to the polysilicon gate 13 (as schematically illustrated in FIG. 1), because the selectivity of the polysilicon etch process is not high enough (please note that high selectivity means that an etch process attacks only the materials it is intended to etch, e.g. the polysilicon in the present example, but not the gate oxide). That is conventional polysilicon RIE etch processes not only attack the polysilicon, but also the oxide layer 15. Due to the low selectivity, the oxide layer 15 is thinner adjacent to the polysilicon gate 13 than the original thickness of the oxide layer (see underneath the polysilicon gate 13), as schematically illustrated in FIG. 1.

It is the nature of the currently used RIE polysilicon etch processes that an improved selectivity reduces the directionality of the etch resulting in undesirable non-vertical (sloped) polysilicon gate side walls 16. In other words, when employing conventional polysilicon RIE processes for the formation of polysilicon gates, either the slope of the side walls increases, or the thin oxide layer 15 is attacked and consequently varies in thickness across the wafer. The polysilicon RIE chemistry can be adjusted to improve the polysilicon/oxide selectivity, but then the RIE etch becomes more isotropic resulting in even more sloped side walls.

As mentioned above, the gate oxide has to become thinner when scaling down the MOSFETs. It is immediately obvious that the thinner the gate oxide is, the less over-etching is acceptable. In other words, the etch selectivity has to be improved in order to be able to make polysilicon gates of very small size. The gate oxide of sub-0.1 micron CMOS FETs, for example, is less than 3 nm thick. Any over-etching impairs the device performance.

The gate length $L_G$ of conventional transistors is defined by photo lithography and a subsequent RIE step, as briefly discussed above. Since the resolution of photo lithography is proportional to the wavelength of the exposing light, the gate length is limited to about 150 nm. Smaller gates can not be made using conventional optical lithography.

Cutting edge production today creates features that are 250 nm wide using 248 nm illumination. Currently, the implementing schemes based on light are the bottleneck when trying to obtain structures of a feature size below 150 nm. State-of-the-art optical lithography systems for making current DRAMs, for example, are quite expensive. The semiconductor industry road map calls for leading-edge manufacturing at 180 nm in the year 2001 and 70 nm in the year 2011.

Alternative processes, such as x-ray lithography, become attractive when moving on to smaller feature sizes, but the required investments are huge. Thus techniques that maintain compatibility with much of the existing processes are inherently valuable.

There are currently no MOSFET fabrication schemes known that would allow to realize MOSFETs with gates of sub-lithographic length and vertical (non-sloped) side walls. Furthermore, the conventional techniques are not suited to make scaled-down FETs having gate lengths of 150 nm and below, as well as intact gate oxides with a thickness of less than 5 nm.

There is some background art of general interest which is related to certain aspects of the invention, such as for example U.S. Pat. No. 4,758,528, U.S. Pat. No. 4,430,791, and U.S. Pat. No. 4,636,822, all three patents currently being assigned to the assignee of the present patent application.

The present patent application is related to U.S. patent application Ser. No. 08/ . . . (Applicant's reference number FI 9-97-165), entitled "FIELD EFFECT TRANSISTORS WITH IMPROVED IMPLANTS AND METHOD FOR MAKING SUCH TRANSISTORS", and U.S. patent application Ser. No. 08/ . . . (Applicant's reference number FI 9-97-164), entitled "FIELD EFFECT TRANSISTORS WITH VERTICAL GATE SIDE WALLS AND METHOD FOR MAKING SUCH TRANSISTORS", both filed on the same day and presently assigned to the assignee of the instant application. The disclosure of these two patent applications is incorporated herein by reference.

It is an object of the present invention to provide a method for the formation of MOSFETs with well defined channel length of less than 150 nm.

It is another object of the present invention to provide a method for the formation of MOSFETs with minimum source and drain resistance, and minimum overlap capacitance.

SUMMARY OF THE INVENTION

The above objectives have been accomplished by the provision of a new and inventive method for the formation of FETs. This method comprises the following steps of:

forming a dielectric stack on a semiconductor structure;

defining an etch window on the dielectric stack;

defining a gate hole in the dielectric stack by transferring the etch window into the dielectric stack using a reactive ion etching (RIE) process;

depositing a side wall layer;

removing the side wall layer from horizontal surfaces of the dielectric stack and gate hole such that side wall spacers remain which reduce the lateral size of the gate hole;

depositing a gate conductor such that it fills the gate hole;

removing the gate conductor covering the portions of the semiconductor structure surrounding the gate hole;

removing at least part of the dielectric stack; and removing the side wall spacers.

The inventive approach substitutes part of the conventional MOS or CMOS process steps usually employed for the definition of the gate conductor by the above sequence of steps.

The above process can be modified in different ways as will be addressed in the detailed description.

Advantages will become obvious form the detailed description and the drawings. It is one advantage that sub-lithographic gate pillars can be formed using conventional photo lithographic steps. It is another advantage that the side walls of the gate pillars are vertical.

DESCRIPTION OF THE DRAWINGS

The invention is described in detail below with reference to the following schematic drawings (not drawn to scale):

FIG. 3 shows key steps of a fabrication sequence, according to the present invention.

DESCRIPTION OF PREFERRED EMBODIMENT:

In the present context, $n^+$ or $p^+$ doped semiconductors are meant to be heavily doped semiconductors. They typically have a concentration of dopants of at least $10^{18}$ to $10^{22}/cm^3$.

When using the word MOSFET in the present context, any kind of MOSFET field effect transistor, including CMOS FETs, NMOS, PMOS and so forth are meant. Also transistors are meant to be covered where there is no oxide serving as isolating layer between gate pillar and channel. Instead of the conventional oxide, any kind of an isolating layer, such as a nitride layer, can be used.

The emphasis of the following description is on polysilicon gates. It is to be noted that instead of polysilicon any material which is suited as gate conductor can be employed. The polysilicon could be replaced by Tungsten, for example. Likewise, a layered structure of polysilicon and silicide, or the like, can be used as gate. Instead of polysilicon, amorphous silicon may be 'filled' into the gate hole, as will be described later. This amorphous silicon can then be transformed into polysilicon by succeeding heat treatments.

Figure 2:
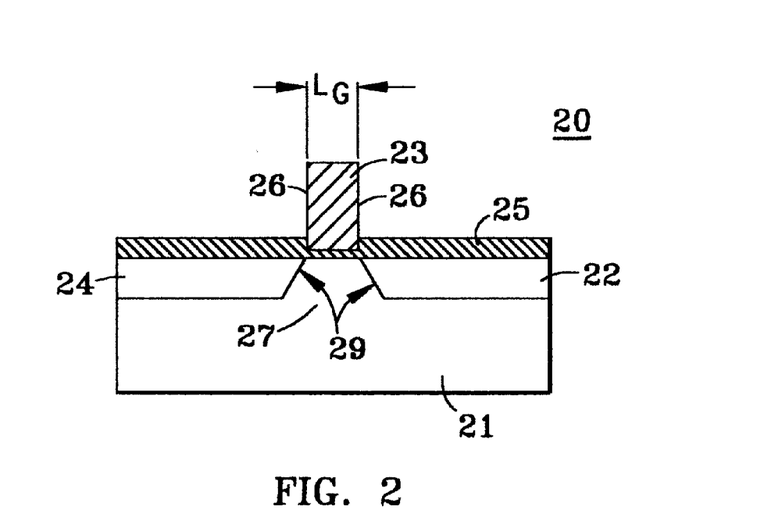
FIG. 2 is a schematic cross section of the basic structure of a MOSFET, according to the present invention.

An FET 20, according to the present invention, is illustrated in FIG. 2. It is formed in a semiconductor substrate 21. This substrate may be a silicon substrate, for example. In the present embodiment, a drain region 22 and a source region 24 are defined by $n^+$ doping. Well suited for n-type doping are: P, As and Sb, for example. For the definition of p-type source and drain regions B, In and Ga may be used. A polysilicon gate 23 is situated on top of a thin $SiO_2$ gate oxide 28. Please note that the surfaces surrounding the gate structure are covered by the remainder of a pad oxide layer which usually is deposited before definition of shallow isolation trenches (not shown in FIG. 2). As in FIG. 1, the electrodes employed for the contacting of gate, source, and drain are not shown. As can be seen, the side walls 26 of the polysilicon gate 23 are vertical. The source/channel and the drain/channel junctions 29 (also referred to as source/channel and drain/channel interfaces) are well defined and abrupt because there are no sloped gate side walls which would allow dopants to enter the region underneath the gate edges when implanting the source and drain regions. The interface 29 is almost vertical. The effective channel length $L_{Geff}$ is thus mainly defined by the length $L_G$ of the gate pillar 26, because there is minimum overlap. It is further to be noted that the gate length $L_G$ is shorter than feasible with conventional photo lithographic techniques. Such a gate is herein referred to as sub-lithographic gate. An FET with sub-lithographic gate is a transistor having a gate conductor where at least one of the lateral dimensions (the gate length or the gate width) is shorter than the smallest possible feature size that can be obtained by conventional optical lithography. That is, the gate length and/or gate width is 150 nm and below.

According to the present invention, a gate hole is formed by transferring a mask window into the dielectric stack. Then a side wall layer is formed and removed from the horizontal surfaces such that side wall spacers remain inside the gate hole. The width of the gate hole minus the thickness of the side wall spacers defines the length $L_G$ and width of the gate pillar to be formed. The verticality of the gate side walls give you minimum overlap and consequentially reduced source drain resistance and decreased overlap capacitance.

A more detailed description will be given in connection with a sequence of steps (illustrated in FIGS. 3A–3L), according to the present invention. It is to be noted that these steps not necessarily have to be executed in the order illustrated and described. The fabrication scheme, according to the present invention, is particularly well suited for the formation of FETs.

Figure 3A:
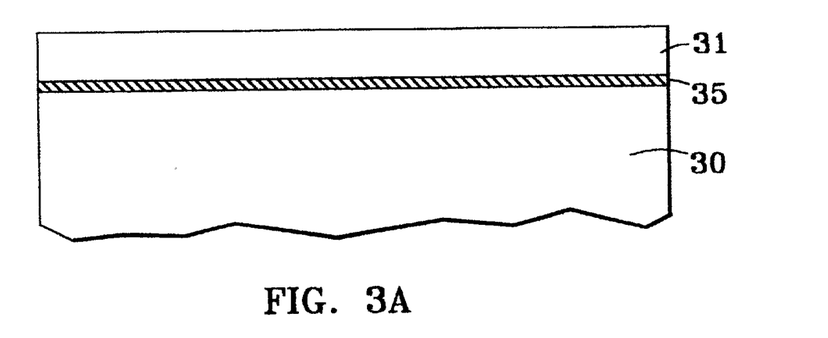
FIG. 3A shows a substrate covered by a pad oxide and a nitride layer.

In the below described example, the formation of an FET, according to the present invention, begins with a substrate 30. This substrate is covered by a pad oxide layer 35 and a nitride layer 31. The substrate 30 may be a silicon substrate, for example. A 10 nm thick $SiO_2$ layer 35 may be used as pad oxide. The pad oxide layer is typically between 5 nm and 20 nm thick. The oxide layer 35 may be made by means of rapid-thermal processing (RTP) or furnace processing.

The nitride layer 31 may consist of $Si_3N_4$ and might have a thickness of about 100 nm. The nitride layer 31 can be made using a high temperature low pressure chemical vapor deposition (LPCVD) process, for instance. Other deposition methods are available, including plasma enhanced chemical vapor deposition (PECVD). Likewise, the nitride can be sputtered.

Figure 3B:
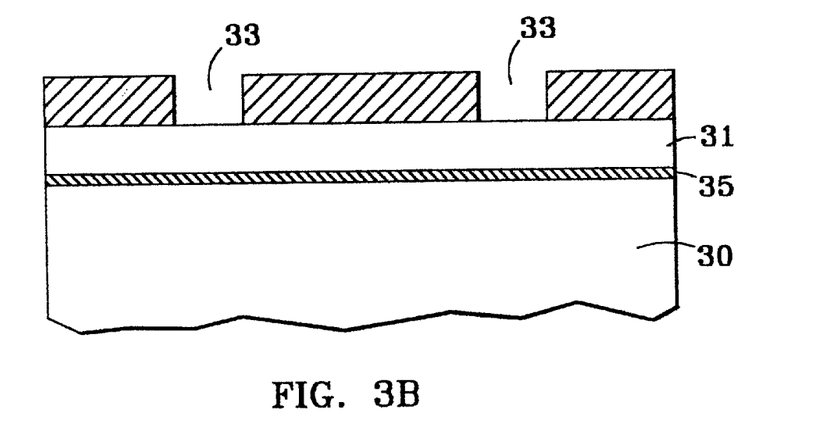
FIG. 3B shows an intermediate fabrication step after a photo resist has been patterned for the etching of STI or LOCOS isolation.

Next, a single-layer photo resist 32 is spinned onto the nitride layer 31. By means of conventional lithography this resist layer 32 is then patterned to define etch windows 33 for a subsequent etch step, as shown in FIG. 3B. Instead of using a single-layer photo resist, a multi-layer resist, or any other mask, e.g. a hard-baked mask, can be used. The shape and size of the etch windows 33 defines the lateral dimensions of the shallow trench isolation (STI) trenches to be etched next. Such STIs (also known as field oxide isolation) are typically used in MOS and CMOS technology to provide for isolation between adjacent transistors. LOCOS (local oxidation of silicon) or poly-buffered LOCOS can be employed instead of STIs.

Figure 3C:
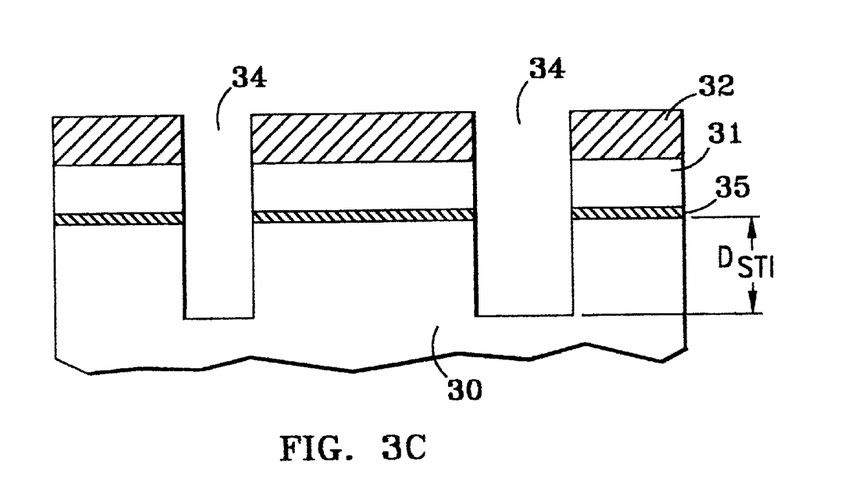
FIG. 3C shows an intermediate fabrication step where the photo resist has been used as etch mask for the etching of STI trenches.

As shown in FIG. 3C, the resist pattern in now transferred into the layered structure underneath by means of an appropriate etch technique. This step is non-critical. The depth $D_{STI}$ of the STI trenches 34 may be 100 nm and more. Before filling the STI trenches with a suited isolator, one may thermally grow a thin oxide layer 46 inside the trenches 34. This is recommended in particular if the trenches 34 are to be filled by tetra ethyl ortho silicate (TEOS), which is a deposited oxide. Deposited TEOS usually has surface states at the interface to the silicon substrate 30. Such surface states are not desired.

Figure 3D:
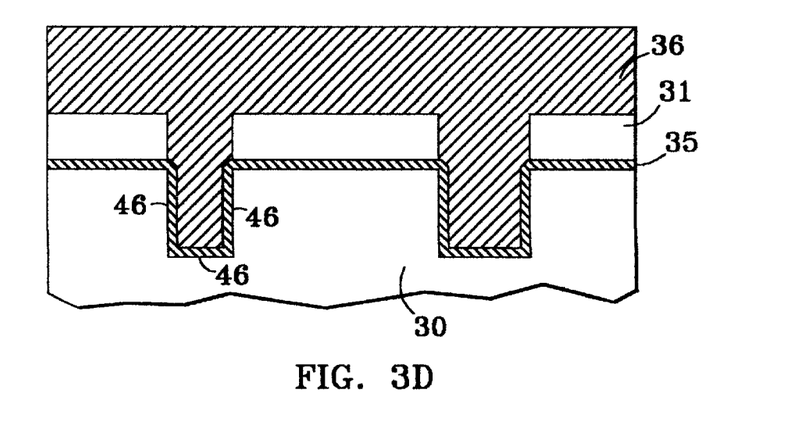
FIG. 3D shows an intermediate fabrication step where the STI trenches have been filled with a TEOS layer.

In the present example, the resist 32 is removed, a thin thermal oxide 46 is formed and then TEOS is deposited such that all STI trenches 34 are filled down to the bottom, as shown in FIG. 3D. TEOS can be deposited using a low pressure chemical vapor deposition (LPCVD) process, for instance. Many other materials can be used instead of TEOS, as long a sufficient isolation of adjacent transistors (which are not shown in FIGS. 3A–3L) is guaranteed.

It is an advantage of TEOS that it provides for a very good stopping layer for any subsequent chemical mechanical polish (CMP) planarization step.

Figure 3E:
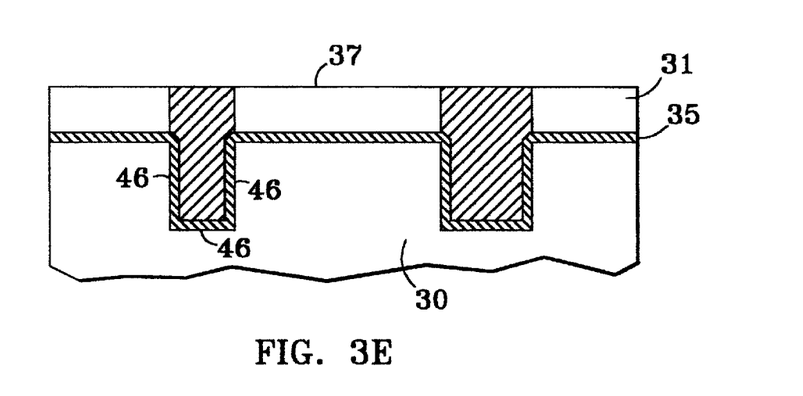
FIG. 3E shows an intermediate fabrication step where the TEOS and part of the nitride layer have been removed by means of planarization.
Figure 3F:
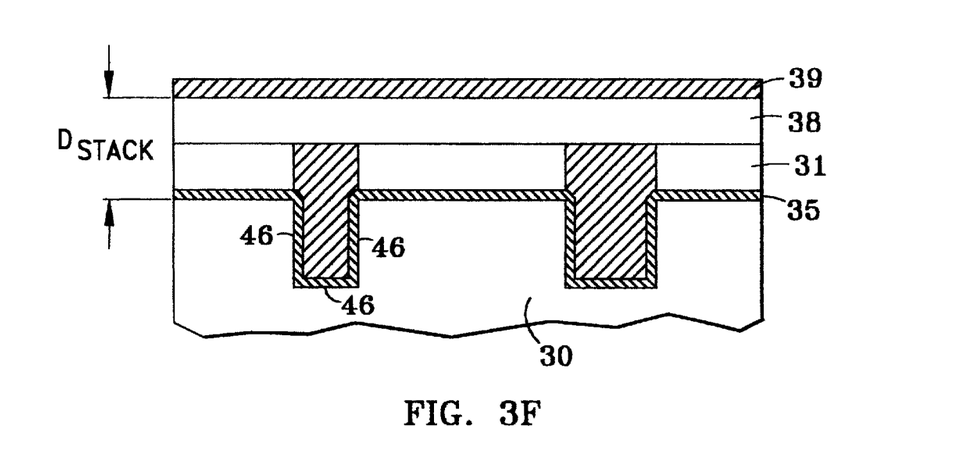
FIG. 3F shows an intermediate fabrication step where additional layers have been formed.

As schematically illustrated in FIG. 3E, the upper surface of the structure is now planarized using CMP, for example. In the present embodiment, the CMP removes the excess TEOS 36 and stops on the nitride layer 31. The upper surface 37 of layer 31 is now completely flat. After CMP, the thickness of this nitride layer 31 is slightly reduced to about 75 nm.

In a subsequent step (see FIG. 3F), the dielectric stack on top of the pad oxide layer 35 is completed by forming additional layers on top of the planarized surface 37. In the present example, the dielectric stack comprises
 a $Si_3N_4$ nitride layer 31 (reduced to about 75 nm thickness);
 a $Si_3N_4$ nitride layer 38 (about 50 nm thick); and
 a TEOS layer 39 (about 60 nm thick).

The TEOS as well as the nitride can be deposited using LPCVD processes, for example. For reasons of compatibility with the existing device technologies, materials such as silicon or nitride and their respective oxides are preferred.

TEOS is well suited as uppermost layer of the dielectric stack because it can be precisely RIE etched. RIE etched TEOS has smooth surfaces. It serves as an excellent hard mask for subsequent RIE etching because the resist pattern can be exactly transferred into the TEOS. It is to be noted, however, that the TEOS is removed when etching the pad oxide at the bottom of the gate hole, as will be discussed in connection with FIG. 3H. The dielectric stack may likewise consist of a polymer, or it may comprise several polymer layers. Any other dielectric stack can be used, as long as it is guaranteed that this stack can be etched in a manner that gate holes with vertical side walls can be formed. It is also important, that highly selective etchants are available for the etching of the gate holes, as will be addressed in connection with FIGS. 3G and 3H. It should also be taken into consideration when choosing the uppermost layer of the dielectric stack that the side wall layer formed in a subsequent step can be easily removed from the horizontal surfaces of the uppermost layer. Furthermore, the dielectric stack—and the one or more layers of which it is composed—should be compatible with existing device technologies.

The dielectric stack may comprise nitride only. Such a nitride-only stack can be etched without attacking the silicon and pad oxide.

In the present embodiments, the dielectric stack is formed on top of a semiconductor structure which already comprises certain layers and structural elements, such as STI or LOCOS trenches. It is to be noted that the dielectric stack can be formed on any kind of semiconductor structure, including a simple substrate, a preprocessed substrate, a semiconductor device comprising other circuits, and so forth.

The expression gate pillar is used in the present context to describe gate structures protruding from the semiconductor structure. The pillar can have any shape and size, as long as at least two of the side walls are vertical, i.e. perpendicular with respect to the semiconductor structure.

In a subsequent step, a photo lithographic process is used to define the lateral size of a gate hole 40 to be formed. As will become clear from the following description, the actual size of the gate pillar 41 to be formed inside the gate hole 40 will be smaller than the size of the gate hole. This step is not illustrated since there are many different ways how the lateral size and shape of the gate hole 40 can be defined. Basically, an etch window 40 is provided in a resist mask 48 (see FIG. 3G), the size and shape of which is about the same as the lateral size and shape of the gate hole 40 to be formed. Please note that the length of the etch window 40 defines the length of the gate hole 40.

In the following, the gate hole formation is described. A gate formation RIE process is employed to transfer the etch window 40 provided in the resist 48 into the dielectric stack (please note that this dielectric stack comprises in the present example nitride layer 31, nitride layer 38, and TEOS layer 39). The gate formation RIE process can be optimized to ensure proper etching of the various layers of the dielectric stack. Several RIE steps, each being optimized for the etching of the respective layer of the dielectric stack, may be carried out. When etching the TEOS layer 39, for example, the selectivity to nitride should be chosen appropriately. Well suited is a selectivity to nitride of 3:1 or better, which means that the TEOS is etched three times faster than the nitride. RIE processes are available which facilitate excellent vertical side walls throughout the dielectric stack. Once the etch window 40 has been precisely transferred into the TEOS layer 39, a second RIE step is carried out. This second RIE step is designed to have high selectivity to the pad oxide 35. A selectivity of nitride to the pad oxide of 5:1 and more is suited. A selectivity of at least 10:1 is preferred.

Figure 3G:
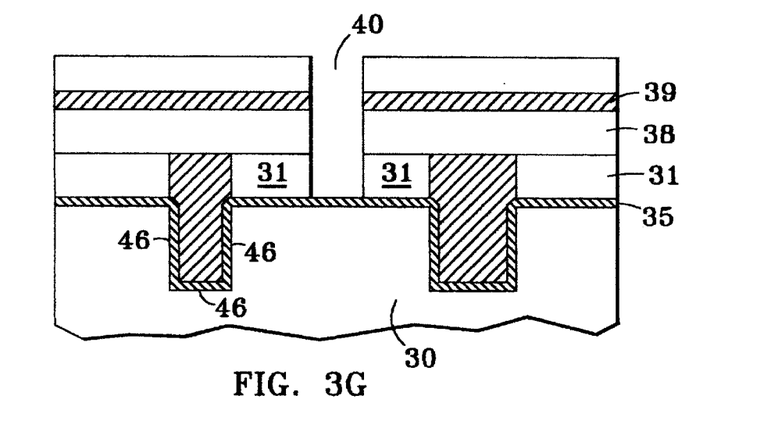
FIG. 3G shows an intermediate fabrication step after a photo resists has been added, lithographically patterned, and a gate hole with vertical side walls has be formed.
Figure 3H:
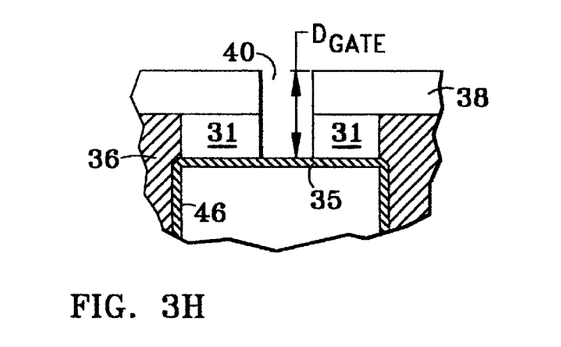
FIG. 3H is a magnified view of the gate hole, after the resist has been removed and the TEOS have been etched away.

In the present example, the second step of the gate formation RIE process is designed to etch the nitride layers 38 and 31 of the dielectric stack and to stop on the pad oxide layer 35, as illustrated in FIG. 3G. This second RIE step is the last RIE step out of a sequence of separately optimized RIE steps. It is important that the selectivity to pad oxide is 5:1 or better, because otherwise the pad oxide 35 may be strongly attacked and its thickness reduced.

After formation of the gate hole 40, one may either remove part of the dielectric stack (as will be described in the following), or one might continue the processing without removing any of these layers. In the present example the TEOS layer 39 is removed before the processing is continued. In this case, the depth $D_{GATE}$ of the gate hole 40 is about the same as the combined thickness $D_{STACK}$ of the layers 31 and 38 (see in FIGS. 3H and 3F). The depth $D_{GATE}$ defines the heights of the gate pillar 41 including gate oxide, both yet to be formed. The pillar serving as gate typically is higher than 100 nm, and in particular between 100 nm and 200 nm. Future CMOS FETs will have a gate length of 150 nm and even less. Such short gates (also referred to as sub-lithographic gates; 150 nm and less) can be easily made using the inventive process. The width (out of the paper plane) of conventional gate electrodes is between 2 $\mu$m and 50 $\mu$m. Also the width of a gate may be sub-lithographic if desired.

Figure 3I:
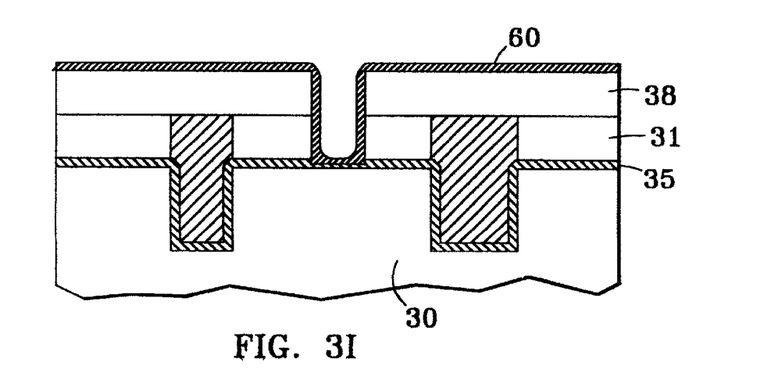
FIG. 3I shows an intermediate fabrication step where a side wall layer has been deposited.

After having defined the gate hole 40 by RIE etching, a thin side wall layer 60 is now deposited, as illustrated in FIG. 3I. It is recommended not to remove the pad oxide 35 before deposition of the side wall layer 60 (see FIG. 3H). This layer 60 may be a nitride layer which conforms well to the vertical side walls of the gate hole 40. The thickness of such a nitride layer can be precisely controlled.

Figure 3J:
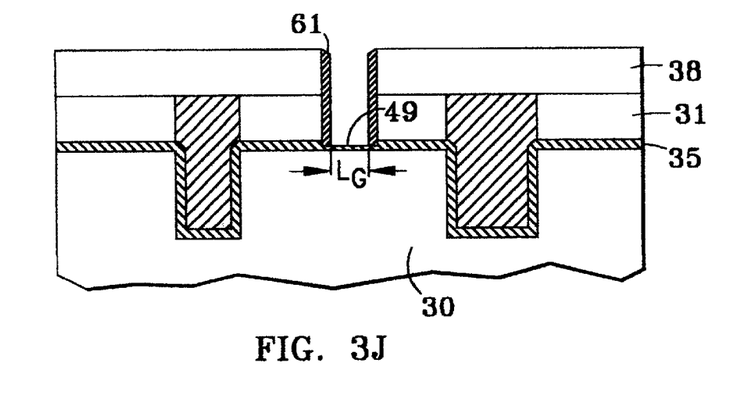
FIG. 3J shows an intermediate fabrication step where the side wall layer has been removed from horizontal surfaces leaving side wall spacers in the gate hole.

A next etch step is now performed to remove the side wall layer 60 from the horizontal surfaces. A blanket RIE (or another etch process) may be used. Since the thickness of the horizontal portions of the side wall layer 60 is rather thin compared to the thickness of the vertical portions (those parts which cover the side walls of the gate hole 40), these horizontal portions can be removed without attacking much of the vertical portions. When this etch step is finished, side wall spacers 61 of well defined thickness are left over, as illustrated in FIG. 3J. These side wall spacers 61 reduce the length of the gate hole 40. The length of the gate hole minus two times the thickness of the side wall layer 60 defines the length LG of the gate 41 to be formed.

Now the leftover of the pad oxide 35 may be removed from the bottom of the hole 40. This can be done using an HF dip. HF does not attack the silicon substrate 30. Before the removal of the TEOS 39 and pad oxide 35 at the bottom of the gate hole 40, the resist is removed. Now a precisely defined gate oxide 49 may be formed as indicated in FIG. 3J. The thickness and quality of this gate oxide 49 is independent of the thickness and quality of the pad oxide layer 35. The gate oxide 49 may also be thicker than the pad oxide, if so desired.

Before the formation of the gate oxide 49, a sacrificial oxide layer (not shown) may be formed at the bottom of gate hole 40. This sacrificial oxide layer could then etched away and the structure be heated. This short sequence of steps allows to heal possible damage (caused by the gate hole formation RIE) of the silicon 30 at the bottom of gate hole 40.

In an alternative embodiment, the RIE process for gate hole formation may be designed such that not only the dielectric stack, but also the pad oxide layer 35 are etched at once. I.e., the RIE process stops on the silicon substrate 30. In this case, the selectivity to silicon of the second RIE etch process needs to be appropriate, because otherwise the silicon 30 at the bottom of the gate hole 40 would be etched away. Once the silicon 30 is exposed at the bottom of the hole 40, one may grow a sacrificial oxide layer, as described above. This is here of greater importance because the RIE damages of the silicon are worst. The sacrificial oxide layer may be about 2 nm thick. Then, the nitride side wall layer 60 is formed and structured such that side wall spacers 61 remain on the vertical surfaces of the gate hole. After this step, the sacrificial oxide layer is removed (etched) and a gate oxide layer 49 is formed by means of oxidation, as described above.

Before formation of the oxide layer 49, the structure might be cleaned using an HF dip, for example.

Figure 3K:
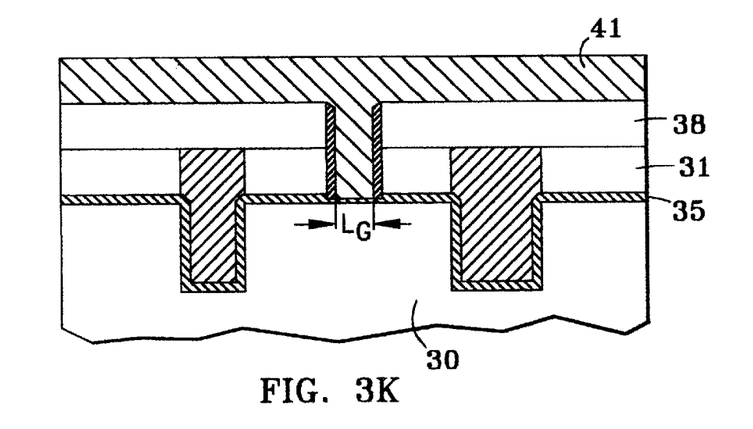
FIG. 3K shows an intermediate fabrication step where the gate hole has been filled with polysilicon. Please note that, before the gate hole is filled, a thin gate oxide layer or other insulating layer is formed at the bottom of the gate hole.

As illustrated in FIG. 3K, polysilicon 41 is now deposited in gate hole 40 and on the uppermost layer 38 of the dielectric stack. It is important to ensure that the polysilicon 41 completely fills the gate hole 40. The polysilicon may be deposited by means of LPCVD (e.g at about 650° C.). As mentioned farther above, one may deposit amorphous silicon instead of polysilicon. The amorphous silicon can then be transformed into polysilicon at a later point in time.

The polysilicon may be un-doped or doped. Dopants can be introduced into the polysilicon either during the polysilicon deposition, or afterwards. It is an advantage of the inventive process that the polysilicon gate does not necessarily have to be doped when the source and drain regions are implanted. The polysilicon gate may in one of the subsequent fabrication steps be silicided (polycide), and a cap dielectric deposited for protection of the gate during subsequent processing, if deemed appropriate.

As mentioned farther above, any material—which is suited as gate conductor—may be 'filled' into the gate hole 40. The present invention is not limited to polysilicon gates.

Figure 3L:
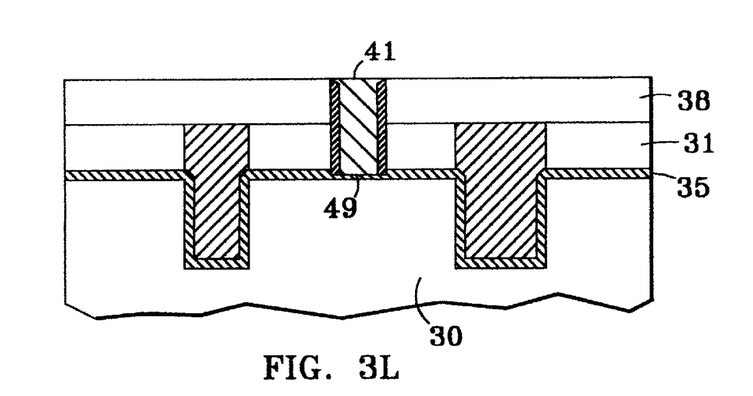
FIG. 3L shows an intermediate step where the polysilicon has been removed by means of planarization.

After deposition of the material 41 serving as gate conductor, a planarization step may be carried out. Well suited is a CMP process. After planarization, the uppermost layer 38 of the dielectric stack is exposed, as illustrated in FIG. 3L.

Last but not least, part or all of dielectric stack has to be removed. In the present example the whole dielectric stack is removed. The nitride layers 38 and 31 are stripped using hot phosphoric acid. If the side wall spacers 61 are the same material as the dielectric stack, these side wall spacers 61 are removed together with the dielectric stack. If the side wall spacer 61 and the dielectric stack consist of different materials, both can be removed separately.

Figure 3M:
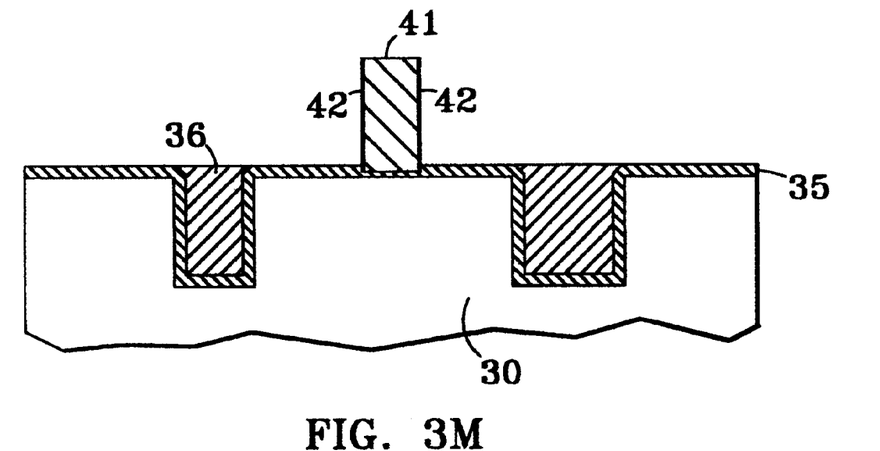
FIG. 3M shows an intermediate fabrication step where the dielectric stack, which consisted of several layers, and the side wall spacers have been removed such that a polysilicon gate pillar with vertical side walls remains.

After complete removal of the dielectric stack and the side wall spacers 61, a protruding gate pillar 41 with vertical side walls 42 is uncovered, as shown in FIG. 3M.

The processing can now be continued in a standard CMOS technology, as described in chapter 10, pages 266–269, of the book "micro electronics processing and device design", by R. A. Colclaser, John Wiley & Sons, 1980 for example.

Figure 3N:
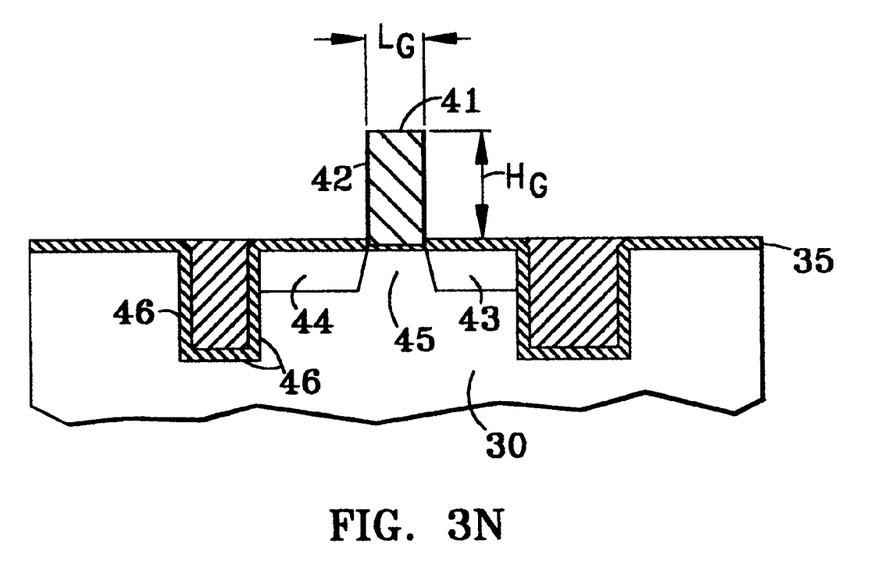
FIG. 3N shows an intermediate fabrication step where dopants were introduced to define source and drain regions.

During the subsequent steps one may define the source 43 and drain regions 44—if not already done so earlier—by implantation of suited dopants, as shown in FIG. 3N. A channel 45 (situated underneath the gate pillar 41 and between drain 44 and source 43) is thus defined. The channel length is about the same as the gate length because the source/channel and drain/channel interfaces are steep and abrupt (well defined), and the overlap is minimized, as discussed already. The length $L_G$ of the gate can be shorter than what can be defined using conventional processes. Gates of sub-lithographic length can be formed by the inventive sequence of steps described above.

Instead of standard source and drain regions obtained by means of implantation, diffused source-drain junctions may be formed by outdiffusion from a polysilicon or dielectric (e.g. BSG, boron silica glass) layer formed on the regions to be doped.

To complete the FET, electrodes have to be provided. Suitable electrodes are made of conducting material, in particular metals, such as Au, Al, Mo, Ta, Ti, Cu, or ITO (indium-tin oxide) being deposited by evaporation and etching, or other techniques. Furthermore, a metallization pattern may now be formed to interconnect adjacent FETs.

The above embodiment and the alternative embodiments addressed above can be modified in various manners, as outlined below.

The $n^+$ doped regions can be replaced by $p^+$ doped regions, for instance. The size and shape of the doped regions can be varied. The substrate could be a p-doped or n-doped Silicon substrate, or a Silicon-On-Insulator (SOI) substrate, just to mention some possible modifications. Well implants can be used to define a p-doped region within an n-doped substrate, for example. This allows to form n-type FETs (also referred to as n-channel FETs or NMOS) within the p-doped region, whereas p-type FETs (also referred to as p-channel FETs or PMOS) can be formed in the n-doped substrate directly. In CMOS technology, the p-well or n-well diffusion is carried out before the source and drain regions are formed.

NMOS as well as PMOS FETs can be formed by means of the inventive process. MOS FETs of different channel type and structure may be made within one and the same substrate. It is also possible to make chips where some transistors have sub-lithographic gates and other transistors have longer gates.

Instead of removing the whole dielectric stack to obtain a protruding gate pillar 41, as illustrated in FIG. 3M, one may remove only part of the dielectric stack.

The process according to the present invention has great potential for fabrication of sub-half micron devices. Please note that a sub-0.1 micron device is a device with gate length $L<0.1$ $\mu$m.

The inventive process is well suited for high density multi-gigabit DRAM fabrication.

FETs according to the present invention can be used in many different kinds of circuits, such as high performance logic, low power logic or high density memory devices, including high density multi-gigabit DRAMs, as mentioned above. The inventive FETs can easily be combined with other elements, such as for example capacitors, resistors, diodes, memory cells and so forth. Because of their small size and ease of fabrication, the present FETs are also suited for use in connection with organic displays or liquid crystal displays (LCDs).

We claim:

1. Method for the formation of a metal oxide semiconductor field effect transistor (MOSFET), comprising the steps:

forming a dielectric stack on a semiconductor structure;
   defining an etch window on said dielectric stack;
   defining a gate hole in the dielectric stack by transferring the etch window into the dielectric stack using a reactive ion etching (RIE) process;
   depositing a side wall layer;
   removing the side wall layer from horizontal surfaces such that side wall spacers remain inside the gate hole thus reducing the lateral size of the gate hole;
   depositing a gate conductor such that it fills the gate hole;
   removing the gate conductor outside the gate hole;
   removing at least part of the dielectric stack; and
   removing the side wall spacers.

2. The method of claim 1, wherein the dielectric stack comprises a nitride layer, preferably a $Si_4N_3$ layer.

3. The method of claim 1, wherein the dielectric stack comprises a tetra ethyl ortho silicate (TEOS) layer.

4. The method of claim 1, wherein the dielectric stack comprises a polymer.

5. The method of claim 1, wherein the etch window is defined using a resist and a subsequent photo lithographic process.

6. The method of claim 1, wherein the etch window is transferred into the dielectric stack using a sequence of reactive ion etching (RIE) steps.

7. The method of claim 1, wherein each step of the sequence of reactive ion etching (RIE) steps is optimized for the respective layer of the dielectric stack it is supposed to etch.

8. The method of claim 1, wherein the sequence of reactive ion etching (RIE) steps is optimized to etch a gate hole with vertical side walls throughout the dielectric stack.

9. The method of claim 7, wherein the last step of the sequence of reactive ion etching (RIE) steps has a selectivity to oxide of at least 5:1.

10. The method of claim 1, wherein a thin gate oxide is formed at the bottom of the gate hole after the removing the side wall layer from horizontal surfaces.

11. The method of claim 10, wherein the thin gate oxide is formed thermally.

12. The method of claim 10, wherein the thin gate oxide has a thickness of less than 5 nm.

13. The method of claim 1, wherein the gate conductor comprises polysilicon or Tungsten.

14. The method of claim 1, wherein a chemical mechanical polishing (CMP) process is used for removing the gate conductor covering the portions of the dielectric stack surrounding the gate hole.

15. The method of claim 1, wherein the whole dielectric stack is removed after formation of the gate pillar.

16. The method of claim 15, wherein the side wall spacers are removed together with the dielectric stack.

17. The method of claim 1, wherein the side wall spacers are removed separately from the dielectric stack.

18. The method of claim 1, wherein the transistor is a device with a gate length ($L_G$) of less than 150 nm.

19. The method of claim 1, wherein the transistor is a device with sub-lithographic gate length ($L_G$).

20. The method of claim 1, wherein the metal oxide semiconductor field effect transistor is a PMOS, NMOS, or CMOS transistor.

21. The method of claim 1, wherein the source and drain regions are formed by implantation of dopants, said source and drain regions each having an abrupt junction to the channel which is situated underneath the edge of the gate pillar and gate oxide.

22. The method of claim 21, wherein the junctions between the source region and channel region and the drain region and channel region are well defined.

23. The method of claim 21, wherein the slope of the junctions between the source region and channel region and the drain region and channel region are steep.

24. The method of claim 1, wherein the effective gate length is defined by the length ($L_G$) of the gate.

25. The method of claim 1, wherein a sacrificial oxide layer is formed at the bottom of the gate hole, the sacrificial oxide layer is then etched away, and the metal oxide semiconductor field effect transistor is heated.

26. The method of claim 1, wherein the pad oxide layer is formed on the semiconductor structure before defining an etch window on said dielectric stack.

27. The method of claim 26, wherein the pad oxide layer is between 5 nm and 20 nm thick.

28. The method of claim 26, wherein the pad oxide layer at the bottom of the gate hole is removed after the step of defining a gate hole in the dielectric stack.

29. The method of claim 26, wherein the pad oxide layer at the bottom of the gate hole is removed using a wet etch.

* * * * *

UNITED STATES PATENT AND TRADEMARK OFFICE
CERTIFICATE OF CORRECTION

PATENT NO. : 6,040,214
DATED : March 21, 2000
INVENTOR(S) : Diane C. Boyd, et al.

It is certified that error appears in the above-identified patent and that said Letters Patent are hereby corrected as shown below:

On The Title Page, [75] Inventors: "Red Hood, NY" should read --Red Hook, NY--

Signed and Sealed this

Third Day of April, 2001

*Attest:*

NICHOLAS P. GODICI

*Attesting Officer*   Acting Director of the United States Patent and Trademark Office